United States Patent [19]

Kohara et al.

[11] Patent Number: 4,654,966
[45] Date of Patent: Apr. 7, 1987

[54] METHOD OF MAKING A DIMENSIONALLY STABLE SEMICONDUCTOR DEVICE

[75] Inventors: Masanobu Kohara; Shin Nakao; Hiroshi Shibata, all of Itami, Japan

[73] Assignee: Mitsubishi Denki Kabushiki Kaisha, Tokyo, Japan

[21] Appl. No.: 783,537

[22] Filed: Oct. 3, 1985

Related U.S. Application Data

[62] Division of Ser. No. 534,840, Sep. 22, 1983, Pat. No. 4,561,011.

[30] Foreign Application Priority Data

Oct. 5, 1982 [JP] Japan .................................. 57-176524
Oct. 5, 1982 [JP] Japan .................................. 57-176525

[51] Int. Cl.⁴ ............................................. H05K 3/34
[52] U.S. Cl. ...................................................... 29/840
[58] Field of Search .................. 361/386, 398; 357/80; 29/825, 840; 174/16 HS, 57 FP

[56] References Cited

U.S. PATENT DOCUMENTS 4,069,498  1/1978  Joshi ................................. 357/80 X
4,092,697  5/1978  Spaight ...................... 174/16 HS X

OTHER PUBLICATIONS

*IBM Technical Discl. Bulletin*, vol. 20, No. 7, Dec. 1977 by H. Krumm.
*IBM Technical Discl. Bulletin*, vol. 22, No. 2, Jul. 1979 by B. T. Clark et al.
*IBM Technical Discl. Bulletin*, vol. 22, No. 6, Nov. 1979 by A. J. Arnold.

*Primary Examiner*—Mark Rosenbaum
*Assistant Examiner*—Carl J. Arbes
*Attorney, Agent, or Firm*—Lowe, Price, LeBlanc, Becker & Shur

[57] ABSTRACT

A heat dissipating member including a heat sink is placed on a module base board with flip-chips mounted thereon, with metallic plates and first adhesive materials of a good thermal conductivity interposed between the heat dissipating member and the flip-chips in a close contact relation and with a second adhesive material interposed between the heat dissipating member and the base board, wherein the first adhesive material is selected to have a melting point lower than that of the second adhesive material, and then such an assembly is heated so that both the first and second adhesive materials are melted and the metallic plates are mounted onto the flip-chips and the heat dissipating member is mounted onto the base board. A gap is formed between the metallic plates and the heat dissipating member as a result of earlier solidification of the second adhesive material than that of the first adhesive material so as to be precisely controlled such that a heat transferring effect therebetween may not be degraded.

6 Claims, 17 Drawing Figures

METHOD OF MAKING A DIMENSIONALLY STABLE SEMICONDUCTOR DEVICE

This is a division of application Ser. No. 534,840, filed Sept. 22, 1983, now U.S. Pat. No. 4,561,011 issued Dec. 24, 1985.

BACKGROUND OF THE INVENTION

1. Field of the Invention

The present invention relates to a semiconductor device and a method of manufacturing the same. More specifically, the present invention relates to a semiconductor device of a modular type wherein semiconductor chips such as flip-chips are mounted on a base board adapted for dissipation of the heat caused by the semiconductor chips and a method of manufacturing the same.

2. Description of the Prior Art

FIG. 1 is a sectional view of one example of a conventional semiconductor device of this type. The semiconductor device shown in FIG. 1 comprises a heat sink 1, a hollow flange 2 having a sectional shape as shown, screws 3 for joining the heat sink 1 to the flange 2, a ring gasket 4 for airtight sealing interposed between the heat sink 1 and the flange 2, flip-chips 6 of such as semiconductor integrated chips by way of semiconductor chips, a module base board 7 for mounting the flip-chips 6 thereon by bonding and mounted to the above described flange 2 and having input and output pins 8 connected thereto, and contact metal 5 interposed between the heat sink 1 and the flip-chips 6, whereby a contacting space 9 is formed to be defined by the heat sink 1, the flange 2, and the module base board 7 and to house the flip-chips 6. In assembling such structure, one end of the flange 2 is mounted onto the module base board 7 with the flip-chips 6 mounted thereon. The respective contact metals 5 are placed on the rear surfaces of the respective flip-chips 6, and then the gasket 4 is disposed on the inner side surface of the flange 2. Then with the bottom of the heat sink 1 in contact with the respective contact metals 5, the fixing portion of the heat sink 1 is joined to the other end of the flange 2, whereupon the heat sink 1 and the flange 2 are fixed with the screws 3, thereby to achieve airtight sealing of the flip-chips 6. The heat produced from the respective flip-chips 6 is transferred to the heat sink 1 serving as a heat dissipating member through the contact metals 5 interposed between the rear surfaces of the respective flip-chips 6 and the heat sink 1.

FIG. 2 is a partial sectional view of another example of a conventional semiconductor device of this type. In the example shown in FIG. 2, a leaf spring 10 of a good thermal conductivity is disposed between the flip-chip 6 and the heat sink 1.

With the structure shown in FIG. 1, a major portion of the heat produced by the respective flip-chips 6 is transferred from the rear surfaces of these flip-chips to the contact metals 5 and is further transferred from the contact metals 5 to the heat sink 1, whereupon the heat is dissipated into the air forcedly supplied. Basically the same as that shown in FIG. 1 applies to the structure shown in FIG. 2 and a major portion of the heat produced by the flip-chips 6 is transferred from the rear surfaces of the flip-chips 6 through the leaf springs 10 to the heat sink 1, whereupon the heat is dissipated into the air.

However, with such conventional semiconductor devices, a disadvantage was involved that, in transfer of the heat produced by the respective flip-chips 6 to the heat sink 1 a contact of the rear surfaces of the flip-chips 6 with thermal conducting members between the heat sink 1 and the flip-chips 6, such as the contact metals 6 in FIG. 1 and the leaf springs 10 in FIG. 2, becomes poor, so that a thermal resistance in such portions becomes very large, whereby a sufficient heat dissipating effect can not be attained. The causes of such poor contact include a poor contact due to uneven heights of the flip-chips 6 as shown in FIG. 3A, reduction of the contacting area between the rear surfaces of the flip-chips and the contact metals 5 due to an inclination of the flip-chips 6 as shown in FIG. 3B, and the like, in the case of the structure shown in FIG. 1, and also reduction of the contacting area between the rear surfaces of the flip-chips and the leaf springs 10 due to uneven heights of the flip-chips 6 as shown in FIG. 4, and the like, in the case of the structure shown in FIG. 2.

FIG. 5 is a sectional view of a further example of a conventional semiconductor device of this type. The semiconductor device shown in FIG. 5 comprises a heat sink 15, a cap 16 made of such as ceramics and mounted to the heat sink 15, an adhesive material 17 of a good thermal conductivity, flip-chips 6 of such as semiconductor integrated circuit chips by way of semiconductor chips, a module base board 7 for mounting the flip-chips 6 thereon by bonding and having input and output pins 8 connected to the module base board 7 and mounted to the cap 16 with an adhesive material 18 and adhesive materials 31 interposed between the cap 16 and the flip-chips 6 at the contacting space 9. In assembling the semiconductor device of the above described structure, the adhesive material 31 of a good thermal conductivity and of a solid state, such as a metal of a low melting point of such as indium, solder or the like, is placed on each of the rear surfaces of the respective flip-chips 6 mounted on the module base board 7. Then the adhesive material 18 of a similar material to that of the above described adhesive material 31 is placed on the module base board 7 at the peripheral end thereof and the cap 16 is placed thereon so as to cover the respective flip-chips 6 and so as to be in contact with the above described adhesive materials 31 on the respective flip-chips 6. Then in such a state the assembly is placed in an atmosphere heated to a temperature for melting the above described adhesive materials 31 and 38, whereby the cap 16 is joined to the module base board 7 with the adhesive material 18 to achieve airtight sealing, while the cap 16 is joined to the rear surfaces of the flip-chips 6 with the adhesive material 31. At that time the above described adhesive material 31 is once melted and is then solidified, whereby the joining portion 9 assures the joining of the cap 16 to the flip-chips 6, with the result that a thermal resistance therebetween is decreased. Then the heat sink 15 is joined onto the cap 16 with the adhesive material 17 of a good thermal conductivity.

Since the semiconductor device thus assembled has rear surfaces of the respective flip-chips 6 joined onto the cap 16 with the adhesive material 31, a thermal resistance therebetween is small and the heat produced by the respective flip-chips 6 is effectively dissipated through a heat dissipating member including the above described cap 16 and the heat sink 15.

Another conventional method of assemblage basically comprises substantially the same way of assemblage as in the case shown in FIG. 5; however, as shown in FIG. 6, contact plates 20 of a good thermal conductivity, such as copper, aluminum or the like are interposed between the rear surfaces of the flip-chips 6 and the cap 16 without joining the rear surfaces of the flip-chips 6 and the cap 16 with an adhesive material of a solid state by melting the same, whereby the heat produced by the flip-chips 6 is transferred through the above described contact plates 20 to the cap 16, and as shown in FIG. 7, leaf springs 21 of a good thermal conductivity of such as copper, aluminum or the like are employed to transfer the heat produced by the flip-chips 6 to the cap 16.

However, in the case where the method shown in FIG. 5 is employed, although a preferred thermal conducting effect can be attained since the flip-chips 6 are completely mounted to the cap 16 with the adhesive material 31 and a thermal resistance therebetween is small, an excessive load could be applied to the flip-chips 6 due to a mechanical stress and the like on the occasion of the joining and deterioration of the characteristics, damages and the like are caused. On the other hand, in the case where the methods shown in FIGS. 6 and 7 are employed, although an influence due to the above described stress can be decreased, a contacting area between the thermal conducting member (the contact plates 20 in the case shown in FIG. 6 and the leaf springs 21 in the case shown in FIG. 7) and the flip-chips 6 and the cap 16 becomes small due to diversification of the height of the flip-chips 6, inclinations thereof and the like, as shown in FIGS. 8, 9 and 10, whereby a thermal resistance is increased, with the result that a sufficient heat dissipating effect can not be attained.

SUMMARY OF THE INVENTION

Accordingly, a principal object of the present invention is to provide an improved semiconductor device, comprising a heat dissipating and enclosing member mounted onto a base board with a semiconductor chip mounted thereon, with a metal plate and a first adhesive material between the heat dissipating and enclosing member and the metal plate, wherein a heat dissipating effect is improved by forming a gap between the semiconductor chip and the heat dissipating and enclosing member such that the gap is precisely controlled as a result of a difference in the melting points of a first adhesive material interposed between the metal plate on the semiconductor chip and the heat dissipating member and a second adhesive material interposed between the heat dissipating member and the base board for mounting the semiconductor chip thereon.

Another object of the present invention is to provide a method of manufacturing a semiconductor device, wherein an assemblage including a base board with a semiconductor chip mounted thereon, a heat dissipating and enclosing member placed on the base board with a metallic plate and a first adhesive material interposed between the heat dissipating and enclosing member and the semiconductor chip and with a second adhesive material interposed between the heat dissipating and enclosing member and the base board, is heated to melt the first and second adhesive members for mounting, whereby a gap is formed between the heat dissipating and enclosing member and the metallic plate so as to be precisely controlled as a result of a difference in the melting points of the first and second adhesive materials.

For the purpose of the present invention, the melting point of the first adhesive material is selected to be lower than that of the second adhesive material. As a result, when both the first and second adhesive materials are heated simultaneously so as to be melted, the second adhesive material between the heat dissipating and enclosing member and the base board is solidified before the first adhesive material between the semiconductor chip and the heat dissipating and mounting member is solidified, whereby a gap is formed between the heat dissipating and mounting member and metal plate on the semiconductor chip such that a gap is precisely controlled.

Hence, an advantage of the present invention is that a gap is formed between a heat dissipating and mounting member and a metal plate on a semiconductor chip such that the gap is precisely controlled so that a thermal conductivity between the heat dissipating and mounting member and the semiconductor device may not be deteriorated, whereby a good thermal conducting effect can be attained.

Another advantage of the present invention is that in assembling the inventive device of such structure, an excessive load is not applied to the semiconductor chip.

A further advantage of the present invention is that in assembling the inventive semiconductor device of such structure diversification of the heights of the semiconductor chips, inclinations of the semiconductor chips and the like can be absorbed by the first adhesive material, whereby a good thermal conducting effect can be attained with the inventive semiconductor device.

These objects and other objects, features, aspects advantage of the present invention will become more apparent from the following detailed description of the present invention when taken in conjunction with the accompanying drawings.

DESCRIPTION OF THE PREFERRED EMBODIMENTS

Figure 1:
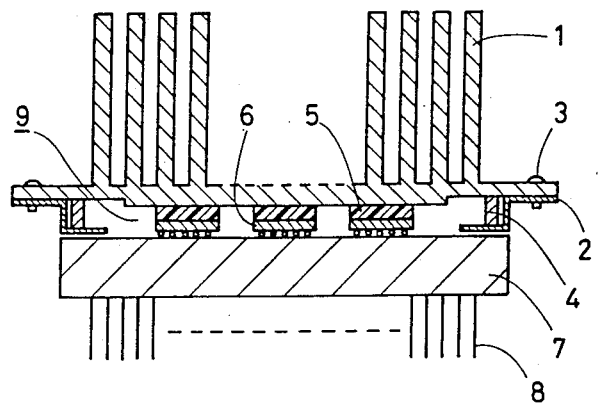
FIG. 1 is a sectional view of one example of a conventional semiconductor device.
Figure 2:
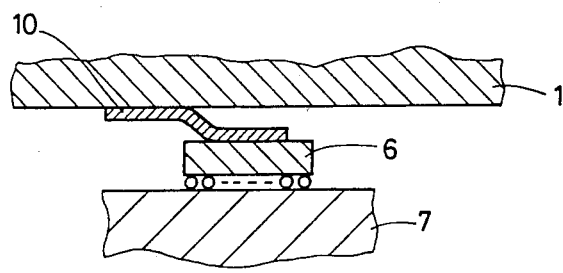
FIG. 2 is a partial sectional view of another example of a conventional semiconductor device.
Figure 3A:
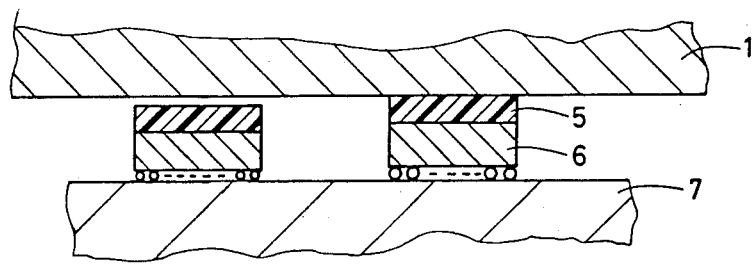
FIGS. 3A, 3B and 4 are partial sectional views for describing the shortcomings involved in the above described conventional semiconductor devices.
Figure 3B:
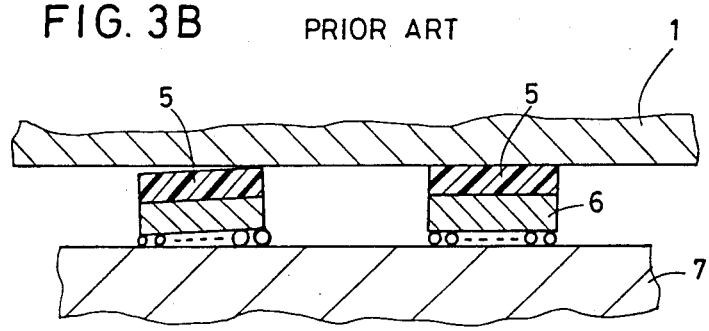
Figure 4:
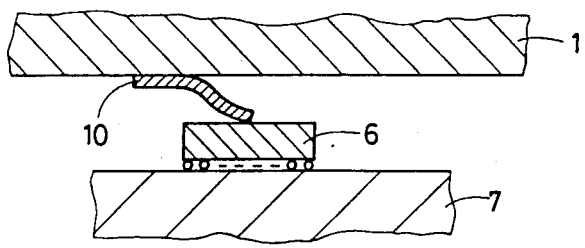
Figure 11:
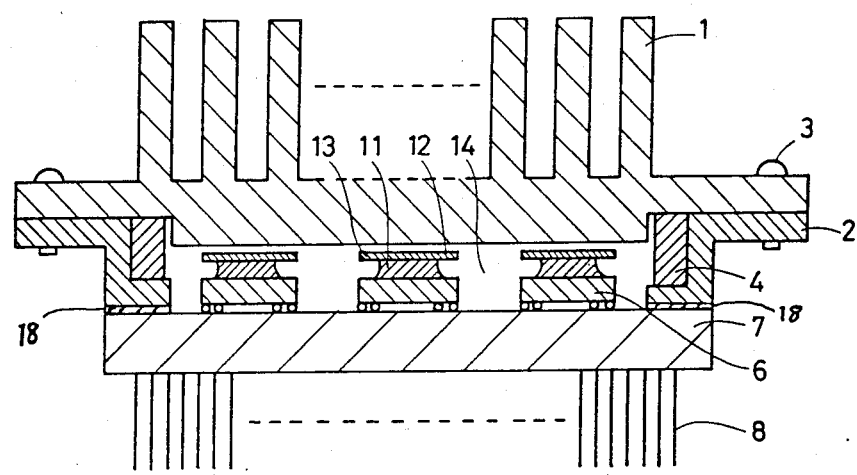
FIG. 11 is a sectional view of one embodiment of a semiconductor device in accordance with the present invention.

FIG. 11 is a sectional view showing one embodiment of a semiconductor device in accordance with the present invention. The semiconductor device of the embodiment shown comprises substantially the same structure as that of the conventional example shown in FIG. 1 in that the flange 2 is mounted at one end thereof to the module base board 7 with the respective flip-chips 6 mounted thereon and the flange 2 is mounted to the heat sink 1 with the screws 3 for airtight sealing; however, the embodiment shown in FIG. 11 is different from the example shown in FIG. 1 in that metallic plates 12 of a thin sheet of a good thermal conductivity of such as copper, aluminum or the like, are jointed onto the rear surfaces of the flip-chips 6 with a first adhesive material 11 of a good thermal conductivity of such as solder and the flange 2 is mounted at one end thereof onto the module base board 7 with a second adhesive material 18. The first adhesive material 11 is selected to have a melting point lower than that of the second adhesive material 18. According to the present invention, a small gap is formed between the heat sink 1 and the metallic plates 12, such that a thermal conducting effect may not be degraded therebetween and a mechanical stress may not be applied to the respective flip-chips 6. Preferably, a gas 14 of good thermal conductivity such as helium or the like may be filled in the space defined by the heat sink 1, the flange 2 and the base board 7 to surround the flip-chips 6 and the metallic plates 12. The mounting of the metallic plates 12 onto the rear surfaces of the flip-chips 6 with the first adhesive material 11 and the mounting of the flange 2 at one end thereof onto the base board with the second adhesive material 18 are carried out by simultaneous heating thereof to the melting points of both first and second adhesive materials. As a result, the gap between the metallic plates 12 and the heat sink 1 is controlled precisely for the above described purposes as a result of earlier solidification of the second adhesive material 18 than that of the first adhesive material 11.

According to the structure of the embodiment shown, since the metallic plates 12 are in complete contact with the rear surfaces of the flip-chips 6 with the first adhesive material 11 of a good thermal conductivity, a thermal resistance therebetween is extremely small and, since the gap between the metallic plates and the heat sink 1 is controlled precisely to be very small and preferably the gas 14 of a good thermal conductivity is filled therein, a thermal resistance therebetween is also very small.

Figure 12:
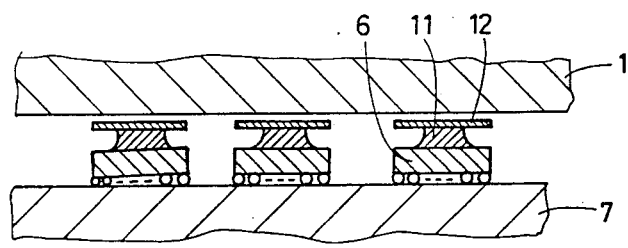
FIG. 12 is a partial sectional view for explaining the advantage of the present invention in accordance with the above described embodiment.

Furthermore, as shown in FIG. 12, since a difference in the gaps between the flip-chips 6 and the heat sink 1 due to inclinations of the flip-chips 6 and diversification of the heights of the flip-chips 6 is absorbed by the first adhesive material 11 for joining the metallic plates 12 onto the flip-chips 6, an increase of a thermal resistance due to a poor contact can be prevented. In addition, a mechanical stress is prevented from being applied to the flip-chips 6 by virtue of the gap 13 in mounting the heat sink 1.

Figure 13:
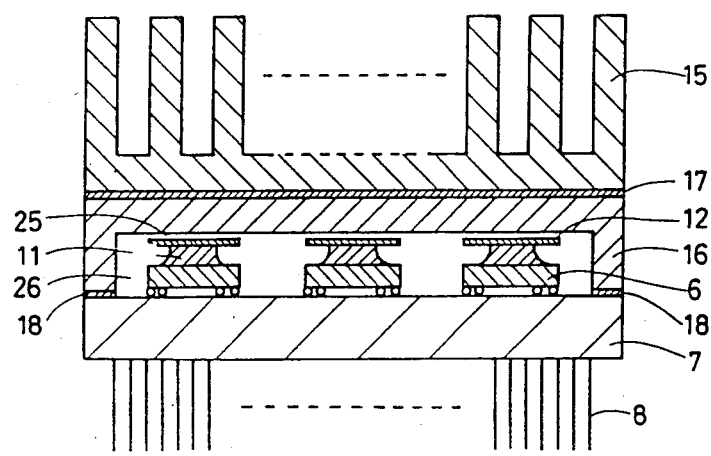
FIG. 13 is a sectional view of another embodiment of a semiconductor device in accordance with the present invention.

Meanwhile, although the above described embodiment was structured such that the flange 2 is mounted at one end thereof onto the module base board 7 with the flip-chips 6 mounted thereon and the heat sink 1 was joined in an airtight manner to the other end of the flange 2, so that the heat produced by the flip-chips 6 may be dissipated through the heat sink 1, the present invention is not limited to such structure and may be structured in a different manner. More specifically, FIG. 13 shows a sectional view of another embodiment of the present invention. In the embodiment shown in FIG. 13, a cap 16 having a concavity for defining a space for receiving the flip-chips 6 is mounted onto the module base board 7 with the second adhesive material 18 of a good thermal conductivity so as to airtight seal the flip-chips 6 and a heat sink 15 is mounted onto the surface of the cap 16 with a third adhesive material 17 of a good thermal conductivity. In FIG. 13, like portions are designated by the same reference characters as those in FIG. 11. The above described adhesive materials 17 and 18 may be different materials. Preferably, the material of the cap 16 is the same as that of the module base board 7 in order to minimize the stress to be caused due to a difference in thermal expansion coefficients thereof.

Figure 14:
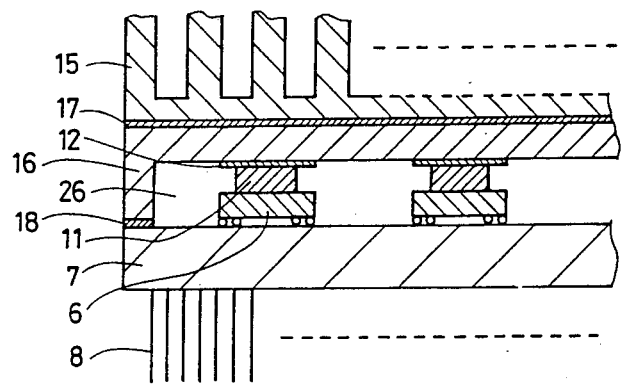
FIG. 14 is a partial sectional view for explaining one embodiment of a method of manufacturing the inventive semiconductor device.

FIG. 14 is a sectional view for explaining a method of manufacturing the semiconductor device of the embodiment shown in FIG. 13. According to the embodiment shown, the first adhesive materials 11 of a good thermal conductivity and in a solid state of a low melting point metal such as indium, solder shaped in a predetermined size plate are placed on the rear surfaces of the respective flip-chips 6 mounted on the module base board 7 and then the metallic plates 12 of a good thermal conductivity of such as copper, aluminum or the like is placed on the first adhesive materials 11. Then the cap 16 made of ceramics or the like is placed on the module base board 7 such that the same is in close contact with the metal plates 12 and so as to cover, the respective flip-chips 6. At that time, the second adhesive material 18 similar to the above described first adhesive material 11 is also interposed simultaneously between the cap 16 and the module base board 7. Thus, the first adhesive materials 11 of plate shape are interposed between the metallic plates 12 and the flip-chips 6 such that the metallic plates 12 are in close contact with the cap 16, as shown in FIG. 14.

Figure 5:
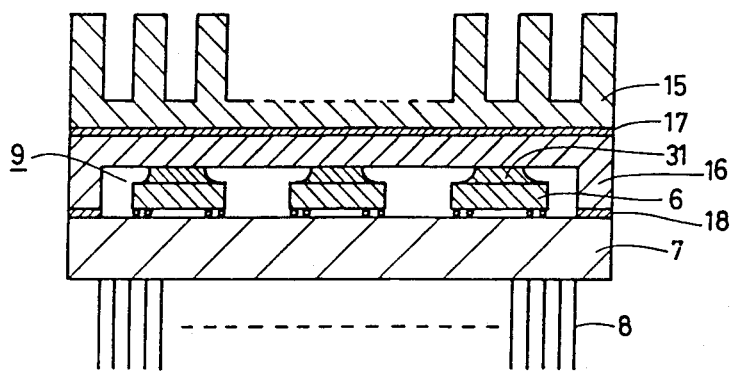
FIG. 5 is a sectional view of a further example of a conventional semiconductor device for explaining one example of assembling the same.
Figure 6:
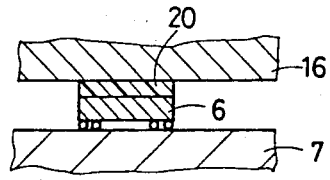
FIGS. 6 and 7 are partial sectional views of a conventional semiconductor device for explaining different methods of assembling the same.
Figure 7:
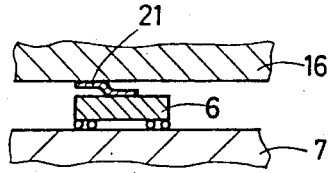
Figure 8:
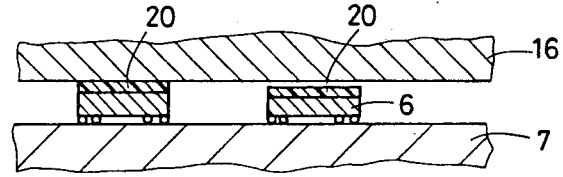
FIGS. 8, 9 and 10 are partial sectional views of a semiconductor device for explaining the shortcomings of the conventional methods.
Figure 9:
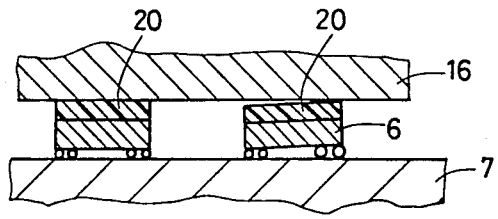
Figure 10:
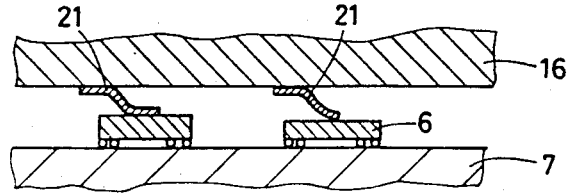

Then the assembled of the semiconductor device including the cap 16 placed on the module base board 7 with the metallic plates 12 and the first adhesive materials 11 between the cap 16 and the respective flip-chips 6 and the second adhesive material 18 interposed between the cap 16 and the base board 7 is placed in an atmosphere furnace heated to the melting points of the first and the second adhesive materials 11 and 18. Then these adhesive materials are melted and the cap is joined to the module base board 7 with the second adhesive material 18 in an airtight manner and at the same time the metallic plates 12 are joined to the rear surfaces of the flip-chips 6 with the above described first adhesive materials 11. On the occasion of melting and solidification of the first adhesive materials 11 in a plate shape, these contract, so that a small gap 13 occurs between the metallic plates 12 and the cap 16, as shown in FIG. 13. If and when the above described atmosphere furnace is selected to be in an atmosphere of helium, hydrogen or the like, it is possible to fill a gas 26 of a good thermal conductivity of such as helium hydrogen or the like in the cap 16. After such steps, the heat sink 1 is mounted onto the cap 16 with the third adhesive material 17 of a good thermal conductivity, whereby a semiconductor device of such a structure shown in FIG. 13 is completed. Meanwhile, preferably the material of the cap 16 for providing airtight sealing is selected to be the same as that of the module base board 7 in order to reduce an influence due to stress caused by the heat between the cap 17 and the module base board 7 on the occasion of the above described mounting. Referring to FIG. 13, like portions are designated by the same reference characters as those Shown in FIG. 5.

Figure 15:
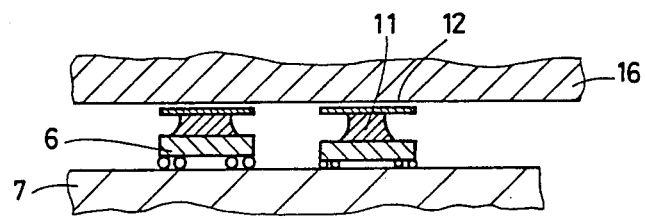
FIGS. 15 and 16 are partial sectional views of the inventive semiconductor device for explaining the advantages of the present invention in accordance with the above described embodiment.
Figure 16:
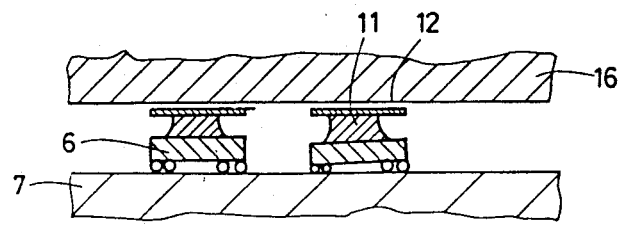

Thus, according to the inventive method, the metallic plates 12 and the first adhesive materials 11 of a good thermal conductivity are interposed in a close contact relation between the flip-chips 6 mounted on the module base board 7 and the cap 16 for airtight sealing the flip-chips 6, whereupon the mounting of the metallic plates 12 onto the flip-chips 6 with the first adhesive material 11 and the mounting of a cap 16 onto the module base board 7 with the second adhesive material 18 are carried out simultaneously by simultaneously heating both adhesive materials 11 and 18 to the melting points thereof, whereupon a gap 25 is formed between the cap 16 and the metallic plates 12 as a result of earlier solidification of second adhesive material 18 than that of the first adhesive material 11. Accordingly, the gap 25 is precisely controlled to be small enough to provide a good heat dissipating effect. In addition, preferably the gas 26 of a good thermal conductivity is filled therebetween. As a result, a thermal resistance between the metallic plates 12 and the cap 16 becomes sufficiently small. Furthermore, an excessive stress is prevented from being applied to the flip-chips 6 by virtue of the above described gap 25 and hence an influence due to a mechanical stress upon the flip-chips 6 can be considerably decreased. Furthermore, diversification of the heights of the flip-chips 6 and a difference in the spacing between the flip-chips 6 and a cap 16 can be absorbed by the first adhesive material 11 for jointing the metallic plates 12 onto the flip-chips 16, as shown in FIGS. 15 and 16. As a result, an increase of a thermal resistance due to a poor contact can be prevented.

Meanwhile, although the metallic plates 12 were shown as selected to be of substantially the same size as that of the flip-chips 6 in the above described embodiment, the metallic plates 12 need not be necessarily made to be of the same size as that of the flip-chips 6 and preferably the metallic plates 12 are larger than the flip-chips 6. In the foregoing, the example of the method was described in which the gas of a good thermal conductivity was filled in simultaneously at the mounting step in the atmosphere furnace; however, the above described gas can be entered at a later step after the airtight sealing. In such a case, however, it is necessary to make adjustment of the pressure to an appropriate value.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of
    preparing a base board,
    preparing a semiconductor chip having two main faces, and to be mounted onto said base board at one of said two main faces,
    mounting said semiconductor chip onto said base board at one of said two main faces,
    preparing a metallic plate of a good thermal conductivity to be mounted onto said semiconductor chip on the other of said two main faces,
    preparing a first adhesive material,
    placing said metallic plate onto said other main face of said semiconductor chip with said first adhesive material interposed between said metallic plate and said other main face of said semiconductor chip,
    preparing a head dissipating and enclosing member to be mounted onto said base board for hermetically enclosing said semiconductor chip and having a portion facing to said metallic plate mounted onto said other main face of said semiconductor chip with a gap therebetween for dissipating the heat of said semiconductor chip,
    preparing a second adhesive material,
    said first adhesive material being selected to have a melting point lower than that of said second adhesive material,
    placing said heat dissipating and enclosing member onto said base board with said second adhesive material interposed between said heat dissipating and enclosing member and said base board and with said metallic plate placed onto said other main face of said semiconductor chip in close contact with said heat dissipating and enclosing member,
    heating said first and second adhesive materials simultaneously to said melting points of said first and second adhesive materials for mounting said metallic plate onto said other main face of said semiconductor chip and for hermetically mounting said heat dissipating and enclosing member onto said base board, whereby a gas is formed between said metallic plate and said portion of said heat dissipating and enclosing member facing to said metallic plate so as to be controlled as a result of earlier solidification of said second adhesive material than that of said first adhesive material.

2. A method of manufacturing a semiconductor device in accordance with claim 1, wherein
    said step of preparing said heat dissipating and enclosing member comprises the steps of
        preparing a heat sink having said portion facing to said metallic plate mounted onto said other main face of said semiconductor chip on the inner surface, and
        preparing a flange interposed between said heat sink and said base board surrounding said semiconductor chip.

3. A method of manufacturing a semiconductor device in accordance with claim 1, wherein
    said step of preparing said heat dissipating and enclosing member comprises the steps of
        preparing a cap having a portion being mounted onto said base board and a space enclosing said semiconductor chip when said cap is mounted onto said base board, said cap having said portion facing to said metallic plate mounted to said other main face of said semiconductor chip on the inner surface of said space, and
        preparing a heat sink mounted to said cap.

4. A method of manufacturing a semiconductor device, in accordance with claim 1, wherein
    said heating step is performed in an atmosphere comprising a gas having a good-thermal conductivity, whereby said gas becomes hermetically sealed within the space between said heat dissipating member and said base board and fills said gap.

5. A method of manufacturing a semiconductor device, in accordance with claim 4, wherein
    said gas comprises hydrogen.

6. A method of manufacturing a semiconductor device in accordance with claim 4, wherein
    said gas comprises helium.

* * * * *